Dec. 13, 1966 R. B. DOME 3,292,099

TWO-STAGE INTERMEDIATE FREQUENCY AMPLIFIER

Filed Sept. 14, 1962 2 Sheets-Sheet 1

INVENTOR:
ROBERT B. DOME,
BY Joseph Levinson
HIS ATTORNEY.

TWO-STAGE INTERMEDIATE FREQUENCY AMPLIFIER

Filed Sept. 14, 1962 2 Sheets-Sheet 2

INVENTOR:
ROBERT B. DOME,
BY Joseph Levinson
HIS ATTORNEY.

3,292,099
TWO-STAGE INTERMEDIATE FREQUENCY AMPLIFIER

Robert B. Dome, Geddes Township, Onondaga County, N.Y., assignor to General Electric Company, a corporation of New York Filed Sept. 14, 1962, Ser. No. 223,699
6 Claims. (Cl. 330—154)

Figure 1:
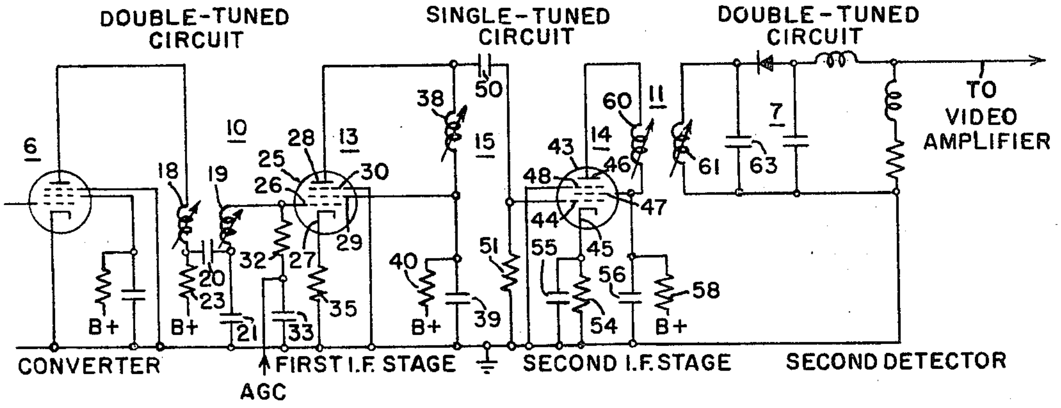

This invention relates to tuned voltage amplifiers and, in particular, to tuned voltage amplifiers for use in the intermediate frequency portion of a radio or television receiver.

In radio and television circuitry it is often desirable to provide high gain in the intermediate frequency amplification stages while maintaining a wide bandwidth in order to preserve the character of the applied signal. Multistage tuned voltage amplifiers are often used to provide the desired high gain, the gain being proportional to the number of stages. The gain of any one of the stages, however, is decreased as the bandwidth of the stage is made wider. Hence, a compromise must be effected between the desired gain and the bandwidth necessary to pass the range of frequencies contained in the intermediate frequency signal of interest.

In the intermediate frequency amplification circuitry of a receiver, it is also desirable to attain maximum selectivity, i.e. differentiation between the signal of interest and signals at other frequencies. Selectivity may also be described in terms of skirt attenuation or attenuation of signals having frequencies outside the band of interest.

Prior art intermediate frequency amplifiers utilize double-tuned and single tuned circuits to attain the desired gain and bandwidth characteristics. The double-tuned circuits are normally over-coupled to produce a gain versus frequency response curve of double-humped or saddle-backed shape. The single-tuned circuit is characterized by a single peak at the resonant frequency. The gain versus frequency response characteristics of the double-tuned and single-tuned circuits are effectively multiplied, with the result that the overall response is flatter than could be provided by either the double-tuned or single-tuned circuits alone. However, in the mass production of receivers, the employment of over coupling in double-tuned circuits is often rendered impractical because of the difficulties arising in properly tuning such circuits in the process of manufacture. By virtue of the double-humped gain versus frequency response characteristic, the tuning process is not the relatively simple one of peaking or maximizing the response at the center frequency as with the single-tuned circuit. In accordance wtih the invention, single and double- tuned circuits are utilized in a manner to permit tuning by a simple peaking operation while providing maximum skirt attenuation.

It is an object of the invention to provide an improved intermediate frequency amplifier.

It is an object of the invention to provide an intermediate frequency amplifier having high gain, satisfactory bandwidth and maximum skirt attenuation.

It is another object of the invention to provide an intermediate frequency amplifier which furnishes maximum skirt attenuation and which may be aligned by a simple peaking process.

In accordance with the illustrated embodiment of the invention, two intermediate frequency amplification electronic devices are coupled by a single-tuned circuit. Double-tuned circuits are employed in the input of the first electronic device and in the output of the second electronic device. The coefficients of coupling of the double-tuned circuits are adjusted to the critical value to attain the flat gain versus frequency response curve characteristic of critically-coupled double-tuned circuits. The double-tuned and single-tuned circuits are tuned to the center frequency of the intermediate frequency signal of interest. The Q's of the double-tuned and single-tuned circuits are adjusted to attain maximum skirt attenuation or selectivity while providing a satisfactory gain and bandwidth for the signal of interest.

Figure 3:
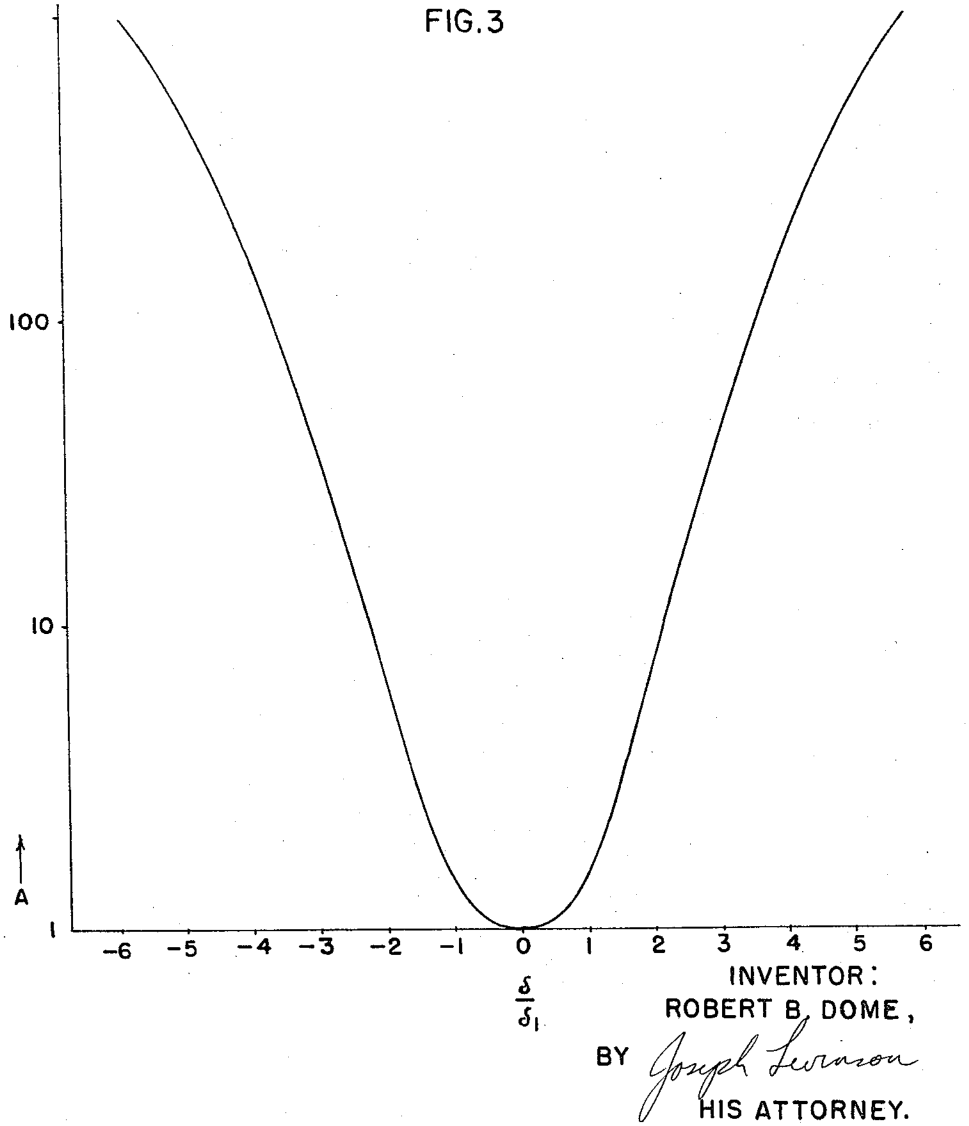
Figure 2A:
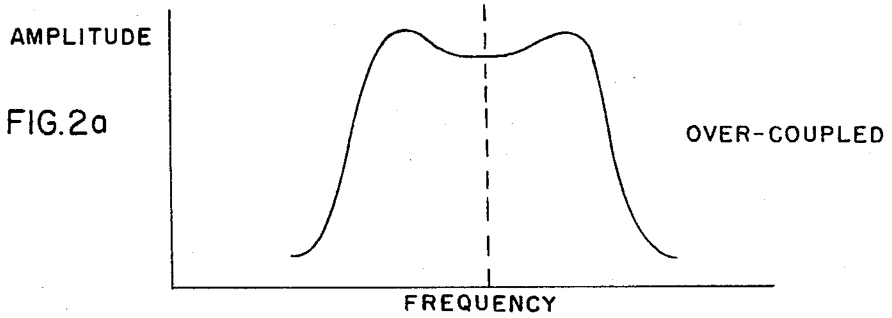
Figure 2B:
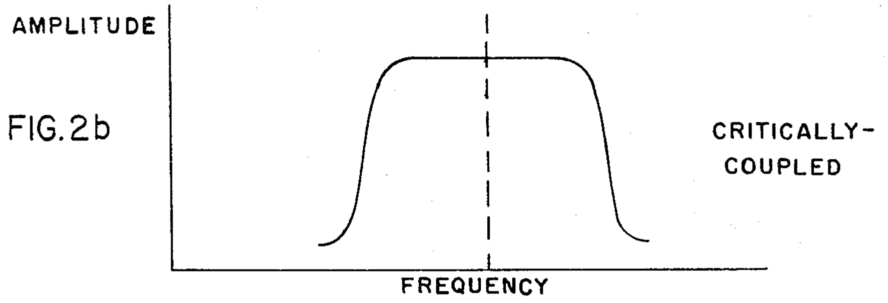
Figure 2C:
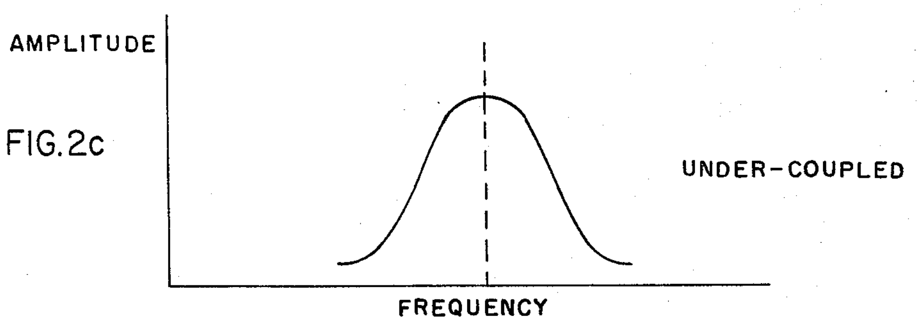

The subject matter of the invention is particularly pointed out and distinctly claimed in the concluding portion of the specification. The invention, however, both as to organization and method of operation may best be understood by reference to the following description taken in connection wtih the accompanying drawings, in which:

FIGURE 1 is a circuit diagram of a two-stage intermediate frequency amplifier incorporating the coupling means of the invention, FIGURES 2*a*–2*c* illustrate the frequency response characteristics of double-tuned circuits for varying degrees of coupling, and FIGURE 3 illustrates the relative response of the circuit of the invention when the circuit Q's are adjusted for maximum skirt attenuation.

FIGURE 1 illustrates a two-stage intermediate frequency (IF) amplifier connected between the converter 6 and the second detector 7 in a television receiver. Double-tuned circuits 10 and 11 are connected between the converter 6 and the first IF stage 13 and between the second IF stage 14 and the second detector 7 respectively. A single-tuned circuit 15 serves to couple the first IF stage 13 and the second IF stage 14.

Double-tuned circuit 10, which serves to couple the frequency translated signal from converter 6 to first IF amplifier stage 13, comprises two coupled resonant circuits. Primary inductor 18 and secondary inductor 19 are interconnected through capacitor 20. The common connection of capacitor 20 and inductor 19 is connected to ground through coupling capacitor 21. Primary inductor 18 and secondary inductor 19 form resonant circuits in conjunction respectively with the shunt capacitances represented by the electronic devices 6 and 13 and the capacitances of the associated wiring. The resonant circuit 18 and 19 are coupled by virtue of the mutual reactance of capacitor 21. Inductors 18 and 19 may be variable, as shown, to enable adjustment of the frequency at which the double-tuned circuit 10 resonates. Double-tuned circuit 10 serves as a load to converter 6, appropriate operating potentials being applied to converter 6 through resistor 23 and primary inductor 18.

First IF amplifier stage 13 comprises an electron tube 25, a pentode in the embodiment shown having an input or control grid electrode 26, a cathode electrode 27, an anode electrode 28, a screen grid electrode 29, and a suppressor grid electrode 30. The input signal to the first IF stage 13 is applied through double-tuned circuit 10 to control grid 26 of tube 25, control grid 26 being connected to secondary inductor 19 of double-tuned circuit 10. A grid leak resistor 32 is connected between control grid 26 and ground through capacitor 33. An automatic gain control (AGC) signal may be applied to control grid 26 through grid leak resistor 32, as indicated. Cathode 27 is connected to ground through bias resistor 35, while suppressor grid 30 is connected directly to ground. The load impedance of tube 25 in first IF stage 13 includes a single-tuned circuit 15 which is connected to anode 28, appropriate operating potential being applied to anode 28 through resistor 40 and a portion of the single-tuned circuit.

One branch of single-tuned circuit 15 which couples first IF stage 13 and second IF stage 14, comprises the serial combination of inductor 38 and capacitor 39 and is connected between anode 28 of tube 25 and ground. The other branch of circuit 15 comprises the associated tube and wiring capacitances. Screen grid 29 of tube 25 is connected to the common connection of inductor 38 and capacitor 39.

Second IF amplifier stage 14 comprises an electron tube 43, a pentode in the illustrated embodiment, having an input or control grid electrode 44, a cathode electrode 45, an anode electrode 46, a screen grid electrode 47 and a suppressor grid electrode 48. The input signal to the second IF stage 14 is that developed across single-tuned circuit 15. The control grid 44 of tube 43 is connected to anode 28 of tube 25 through coupling capacitor 50 and to ground through grid leak resistor 51. Cathode 45 of tube 43 is connected to ground through bias resistor 54 which is shunted by by-pass capacitor 55. Suppressor grid 48 is connected directly to ground, while screen grid 47 is connected to ground through capacitor 56. The load impedance of tube 43 in second IF stage 14 is the double-tuned circuit 11 which is connected to anode 46, an appropriate operating potential being applied to anode 46 through resistor 58 and a portion of the double-tuned circuit.

Double-tuned circuit 11 comprises a primary inductor 60 and a secondary inductor 61, capacitor 56 being serially connected between a terminal of the primary inductor 60 and ground while a capacitor 63 is connected across the secondary inductor 61. Resistor 58 is connected to the common connections of inductance 60 and capacitor 56. The combination of primary industor 60 and the output capacitance of tube 43 and associated wiring comprises a first resonant circuit while the combination of secondary inductor 61 and capacitor 63 comprises a second resonant circuit. Coupling between the respective resonant circuits is provided by virtue of the mutual inductance between primary and secondary inductors 60 and 61.

The output of double-tuned circuit 11 is applied to second detector 7, the intelligence signal derived by the second detector being applied to an appropriate amplifier, e.g., the video amplifier if the circuit of the invention is employed in a television receiver.

An important consideration in an intermediate frequency amplifier is the amount of discrimination that is obtained against signals of frequencies differing from the frequency of the signal of interest. The degree of discrimination may be expressed in terms of selectivity or skirt attenuation. In accordance with the invention, maximum skirt attenuation is attained by selection of particular circuit Q's.

The general equation for the attenuation of a double-tuned circuit is $$A=\sqrt{1-2\left(1-\frac{n}{2m}\right)Z^2+Z^4} \quad (1)$$

where:

$A$=Attenuation $$m=\frac{1}{Q_1Q_2}+K^2$$

$$n=\left(\frac{1}{Q_1}+\frac{1}{Q_2}\right)^2$$

$$Z=\frac{2\delta}{\sqrt{m}}$$

where:

$k$=coupling coefficient $Q_1$=Q of primary circuit $Q_2$=Q of secondary circuit $$\delta=\frac{\Delta f}{f_0}=\frac{\text{frequency deviation from } f_0}{\text{center or resonant frequency } f_0}$$

It is desirable that the double-tuned circuits be critically coupled since critical coupling provides maximum flatness of the pass-band and a single peak, as shown in FIGURE 2*b*. The single peak is desirable because tuning may be effected by maximizing response at the center frequency. FIGURE 2*a* illustrates the response of an over-coupled double-tuned circuit with its characteristic double hump which impedes assembly line tuning while FIGURE 2*c* illustrates the response curve of an under-coupled, double-tuned circuit with its rounded response curve indicating excessive non-uniform response in the pass-band. In accordance with the invention, critically-coupled double-tuned circuits are employed, because of their comparatively wide band response, to facilitate tuning, although slightly under-coupled double-tuned circuits may also be utilized, a simple voltmeter being required to maximize the response at the center frequency rather than an oscilloscope, as required if over-coupled circuits are employed.

When coupling is critical, the coefficient of $Z^2$ in Equation 1 is zero, or $$\frac{n}{2m}=1$$

so that Equation 1 reduces to $$A=\sqrt{1+Z^4} \quad (2)$$

Substituting for Z in Equation 2 its value of $2\delta/\sqrt{m}$, $$A=\sqrt{1+\frac{16\delta^4}{m^2}} \quad (3)$$

Since $$\frac{n}{2m}=1$$

$$m=\frac{n}{2}$$

Substituting for $n$ its equivalent, $$m=\tfrac{1}{2}\left(\frac{1}{Q_1}+\frac{1}{Q_2}\right)^2$$

Substituting this for $m$ in Equation 3, $$A=\sqrt{1+\frac{16\delta^4}{\tfrac{1}{4}\left(\frac{1}{Q_1}+\frac{1}{Q_2}\right)^4}}=\sqrt{1+\frac{64\delta^4}{\left(\frac{1}{Q_1}+\frac{1}{Q_2}\right)^4}} \quad (4)$$

Let $$\delta_1=\frac{\text{frequency deviation from } f_0 \text{ where system } A=\sqrt{2}}{\text{center or resonant frequency } f_0} \quad (4a)$$

$$\frac{64}{\left(\frac{1}{Q_1}+\frac{1}{Q_2}\right)^4}=\frac{a}{\delta_1^4} \text{ or } a=\frac{64\delta_1^4}{\left(\frac{1}{Q_1}+\frac{1}{Q_2}\right)^4} \quad (4b)$$

Sustituting in Equation 4

$$A=\sqrt{1+a\left(\frac{\delta}{\delta_1}\right)^4} \quad (5)$$

Equation 5 is a convenient expression for the attenuation of a double-tuned circuit. The term $a$ is a function of constants and the circuit Q's and may be designated the "Q factor." The term $\delta/\delta_1$ expresses the ratio of frequency deviation from the center frequency to the frequency deviation at which the overall system attenuation A has a value which is $\sqrt{2}$ times its value at the center frequency. The "system" may consist of any number of double-tuned critically coupled circuits and any number of single-tuned circuits, although in the specific system here considered, the system consists of two double-tuned circuits and one single-tuned circuit.

By a similar derivation, the attenuation of a single-tuned circuit may be expressed as $$A=\sqrt{1+\frac{a\delta^2}{\delta_1^2}} \quad (6)$$

where:

$$a=4Q^2\delta_1^2 \quad (6a)$$

Q being the Q of the single-tuned circuit.

The attenuation equations for the single-tuned circuit and the two double-tuned circuits, tuned to the center frequency of the signal of interest, utliized in the IF amplifier of the invention are thus given as follows:

$$A_{15}=\sqrt{1+a\frac{\delta^2}{\delta_1^2}} \quad (7)$$

$$A_{10}=\sqrt{1+b\frac{\delta^4}{\delta_1^4}} \quad (8)$$

$$A_{11}=\sqrt{1+c\frac{\delta^4}{\delta_1^4}} \quad (9)$$

where:

$A_{15}$=attenuation for single-tuned circuit 15,
$a$=Q factor for single-tuned circuit 15,
$A_{10}$=attenuation for double-tuned circuit 10,
$b$=Q factor for double-tuned circuit 10,
$A_{11}$=attenuation for double-tuned circuit 11,
$c$=Q factor for double-tuned circuit 11.

The overall system attenuation is given by the product, or $$A=A_{15}A_{10}A_{11}=\sqrt{\left[1+a\frac{\delta^2}{\delta_1^2}\right]\left[1+b\frac{\delta^4}{\delta_1^4}\right]\left[1+c\frac{\delta^4}{\delta_1^4}\right]} \quad (10)$$

Equation 10 expresses the relative response or the ratio of overall attenuation to attenuation at the center frequency.

The bandwidth of an amplifier system is defined as that range of frequencies over which the power amplification does not drop to less than one-half, or −3 db, of the power amplification at resonance. This corresponds to the voltage amplification dropping to $1/\sqrt{2}$ of its maximum value. Expressed in terms of attenuation, it corresponds to the voltage attenuation increased to $\sqrt{2}$ of its minimum value.

The Q factors, $a$, $b$, and $c$, may be arbitrarily chosen so long as $A=\sqrt{2}$ when $$\frac{\delta}{\delta_1}=1$$

Thus, equation 10 may be written as $$\sqrt{2}=\sqrt{[1+a][1+b][1+c]}$$

or, squaring both sides $$2=[1+a][1+b][1+c] \quad (11)$$

$a$, $b$, and $c$ may be solved for in terms of the other two variables, viz $$a=\frac{2}{[1+b]\,[1+c]}-1 \quad (12)$$

$$b=\frac{2}{[1+a]\,[1+c]}-1 \quad (13)$$

$$c=\frac{2}{[1+a]\,[1+b]}-1 \quad (14)$$

It is desirable to select circuit Q's providing the greatest selectivity or skirt attenuation. The Q factors corresponding to optimum skirt attenuation can be derived by writing Equation 10 for the case where $$\frac{\delta}{\delta^1}\gg l$$

viz $$A^2=abc\left(\frac{\delta}{\delta^1}\right)^{10} \quad (15)$$

Assuming that $a$ is given and that $b$ and $c$ are chosen, as by Equations 13 and 14, so that they are nearly equal to each other, letting $$b=r+\epsilon \quad (16)$$

and $$c=r-\epsilon \quad (17)$$

where $r$ is an arbitrary value and $\epsilon$ is a small increment. Then $$A^2=a[r+\epsilon]\,[r-\epsilon]\left(\frac{\delta}{\delta_1}\right)^{10}$$

$$=a[r^2-\epsilon^2]\left(\frac{\delta}{\delta_1}\right)^{10} \quad (18)$$

Differentiating with respect to $\epsilon$ $$\frac{d(A)^2}{d\epsilon}=-2a\left(\frac{\delta}{\delta_1}\right)^{10}\epsilon \quad (19)$$

Setting the derivative equal to zero, and solving for the value of $\epsilon$ which maximizes the function, $$\epsilon=0 \quad (20)$$

Thus, if $a$ is chosen, the best skirt attenuation is obtained when $b=c$. If $b$ had been arbitrarily chosen, optimum skirt attenuation would occur when $a=c$, or if $c$ had been chosen, the condition when $a=b$ would be optimum. Therefore, the overall optimum skirt attenuation is obtained when $$a=b=c \quad (21)$$

From Equation 11, $$2=(1+a)^3 \quad (22)$$

or $$a=2^{1/3}-1$$
$$=0.259921\approx 0.26=b=c \quad (23)$$

The Q factor of 0.26 permits easily realizable circuit Q's.

The attenuation equation may be written from Equation 10 as $$A=\sqrt{\left[1+0.26\left(\frac{\delta}{\delta_1}\right)^2\right]\left[1+0.26\left(\frac{\delta}{\delta_1}\right)^4\right]\left[1+0.26\left(\frac{\delta}{\delta_1}\right)^4\right]} \quad (24)$$

FIGURE 3 illustrates graphically the relative response expressed in equation 24.

The following example is used to illustrate the way in which the information contained in Equation 23 is used to determine the optimum Q's of the circuits. Suppose the center IF frequency, $f_0$, is to be 44.23 mc. and that the overall attenuation is to be $\sqrt{2}$ at frequencies 1.28 mc. either side of $f_0$. From Equation 4$a$.

$$\delta_1=\frac{1.28}{44.23}=0.029 \quad (25)$$

Substituting this and 0.26 for $a$ as determined by Equation 23 into Equation 4$b$, and solving for $(1/Q_1+1/Q_2)$, $$\frac{1}{Q_1}+\frac{1}{Q_2}=\left[\frac{64\delta_1^4}{a}\right]^{1/4}=0.1625 \quad (26)$$

Since the primary Q's are essentially infinite in both double-tuned circuits because of the very high resistances shunting each of the primary circuits, Equation 26 reduces to $$\frac{1}{Q_2}=0.1625 \text{ or } Q_2=6.15 \quad (27)$$

In the case of the single-tuned circuit, in Equation 6$a$ where $\delta_1=0.029$ as determined by Equation 25 and where $a=0.26$ as determined by Equation 23, Q may be solved for and becomes $$Q=\left(\frac{a}{4\delta_1^2}\right)^{1/2}=\left(\frac{0.26}{4(0.029)^2}\right)^{1/2}=8.8 \quad (28)$$

In the first double-tuned circuit, $Q_2$ may be adjusted by selecting the proper resistance for resistor 32. In the second double-tuned circuit, $Q_2$ may be adjusted by selecting the proper L/C ratio in view of the diode load resistance loading, where L is the inductance of the secondary 61 and C is the capacitance of condenser 63. The Q of the single-tuned circuit may be adjusted by selecting the proper resistance for resistor 51.

In summary, the preceding analysis defines the relationship between the Q factors of the tuned circuits of an amplifier which provides maximum skirt attenuation, the tuned circuits being tuned to the center frequency of the signal of interest and the double-tuned circuits being critically-coupled. In particular, the analysis defines the optimum value of the Q factors for a two-stage amplifier employing five tuned circuits comprised of two double tuned coupled-circuits and a single-tuned circuit.

Thus, the two-stage, intermediate frequency amplifier of the invention provides satisfactory gain and bandwidth while providing maximum skirt attenuation or selectivity. In addition, the amplifier avoids over-coupled double-tuned circuits which impede assembly line tuning.

Although the invention has been described with reference to a specific embodiment, the invention is not limited to this embodiment. For example, the IF amplifier of the invention is not limited to two stages, nor to the particular arrangement of single-tuned and double-tuned circuits illustrated. It is intended in the appended claims to claim all such variations as fall within the true spirit and scope of the invention.

What is claimed as new and desired to be secured by Letters Patent of the United States is:

1. A two-stage intermediate frequency amplifier for providing high gain and an overall bandwidth satisfactory for passing the intermediate frequency signal and for providing maximum skirt attenuation comprising:

(a) a first amplifier stage having an input and an output, (b) a second amplifier stage having an input and an output, (c) a first critically coupled double-tuned circuit connected to the input of said first amplifier stage, (d) a single-tuned circuit connected between the output of said first amplifier stage and the input of said second amplifier stage, (e) a second critically coupled double-tuned circuit connected to the output of said second amplifier stage, (f) said first and said second double-tuned circuits and said single-tuned circuit being tuned to the center frequency of the intermediate frequency signal and adjusted so that the frequency response of each exhibits only one frequency peak.

2. A two-stage intermediate frequency amplifier for providing high gain and an overall bandwidth satisfactory for passing the intermediate frequency signal and for providing maximum skirt attenuation comprising:

(a) a first amplifier stage having an input and an output, (b) a second amplifier stage having an input and an output, (c) a first tuned circuit connected to the input of said first amplifier stage, (d) a second tuned circuit connecting the output of said first amplifier stage to the input of said second amplifier stage, (e) a third tuned circuit connected to the output of said second amplifier stage, (f) said first, second, and third tuned circuits being tuned to the center frequency of the intermediate frequency signal and having Q factor values which are substantially equal to each other.

3. A two-stage intermediate frequency amplifier for providing high gain and an overall bandwidth satisfactory for passing the intermediate frequency signal and for providing maximum skirt attenuation comprising:

(a) a first amplifier stage having an input and an output, (b) a second amplifier stage having an input and an output, (c) a first double-tuned circuit connected to the input of said first amplifier stage, (d) means connecting the output of said first amplifier stage to the input of said second amplifier stage, (e) a second double-tuned circuit connected to the output of said second amplifier stage, (f) said first and said second double-tuned circuits being critically-coupled and tuned to the center frequency of the intermediate frequency signal and having Q factor values which are substantially equal to each other.

4. A two-stage intermediate frequency amplifier for providing high gain and an overall bandwidth satisfactory for passing the intermediate frequency signal and for providing maximum skirt attenuation comprising:

(a) a first amplifier stage having an input and an output, (b) a second amplifier stage having an input and an output, (c) a single-tuned circuit connected between the output of said first stage and the input of said second stage and having an attenuation expressed as $$A=\sqrt{1+a\frac{\delta^2}{\delta_1^2}}$$

(d) a first, double-tuned circuit connected to the input of said first amplifier stage and having an attenuation expressed as $$A=\sqrt{1+b\frac{\delta^4}{\delta_1^4}}$$

(e) a second, double-tuned circuit connected to the output of said second amplifier stage and having an attenuation expressed as $$A=\sqrt{1+c\frac{\delta^4}{\delta_1^4}}$$

where $\delta/\delta$ expresses the ratio of frequency deviation from the center frequency to the frequency deviation at which the overall system attenuation is $\sqrt{2}$ of its value at the center frequency and where *a*, *b*, and *c* are functions of the respective circuit Q's, (f) the factors *a*, *b* and *c* of said attenuation equations having substantially identical values.

5. The intermediate frequency amplifier of claim 4 in which the factors *a*, *b*, and *c* are defined as follows:

$$a=4Q^2\delta_1^2$$

$$b=c=\frac{64\delta_1^4}{\left(\frac{1}{Q_1}+\frac{1}{Q_2}\right)^4}$$

where Q is the circuit Q of the single-tuned circuit and $Q_1$ and $Q_2$ are the primary and secondary circuit Q's respectively of each of the double-tuned circuits.

6. The intermediate frequency amplifier of claim 4 in which the factors *a*, *b*, and *c* are approximately equal to 0.26.

References Cited by the Examiner

UNITED STATES PATENTS

| | | | |
|---|---|---|---|
| 1,834,408 | 12/1931 | Latour | 330—154 |
| 2,171,135 | 8/1939 | Atkinson | 330—154 X |
| 2,357,442 | 9/1944 | Dodington | 330—154 X |
| 2,901,600 | 8/1959 | Megard | 330—154 X |

FOREIGN PATENTS

| | | |
|---|---|---|
| 820,717 | 9/1959 | Great Britain. |

ROY LAKE, *Primary Examiner.*

N. KAUFMAN, *Acting Examiner.*